(12) United States Patent
O'Leary et al.

(10) Patent No.: US 7,113,842 B2
(45) Date of Patent: Sep. 26, 2006

(54) METHOD FOR TRANSFERRING PROCESS CONTROL MODELS BETWEEN PLASMA PROCESSING CHAMBERS

(75) Inventors: Kevin O'Leary, Lucan (IE); Francisco Martinez, Raheny (IE); Marcus Carbery, Artane (IE)

(73) Assignee: Scientific Systems Research Limited, Dublin (IE)

( * ) Notice: Subject to any disclaimer, the term of this patent is extended or adjusted under 35 U.S.C. 154(b) by 0 days.

(21) Appl. No.: 11/157,644

(22) Filed: Jun. 21, 2005

(65) Prior Publication Data
US 2006/0042753 A1 Mar. 2, 2006

(30) Foreign Application Priority Data
Aug. 26, 2004 (IE) ................................ 2004/0568

(51) Int. Cl.
*G06F 19/00* (2006.01)
(52) U.S. Cl. ................................................ 700/121
(58) Field of Classification Search ................ 700/121
See application file for complete search history.

(56) References Cited

U.S. PATENT DOCUMENTS

| 5,549,677 | A | 8/1996 | Durr et al. |
|---|---|---|---|
| 5,808,415 | A | 9/1998 | Hopkins |
| 6,441,620 | B1 | 8/2002 | Scanlan et al. |
| 6,748,280 | B1 | 6/2004 | Zou et al. |
| 6,781,383 | B1 | 8/2004 | O'Leary et al. |
| 2003/0153989 | A1 | 8/2003 | Scanlan et al. |
| 2005/0019961 | A1* | 1/2005 | Davis et al. ............... 438/7 |
| 2005/0234574 | A1* | 10/2005 | Lam et al. ............... 700/96 |

FOREIGN PATENT DOCUMENTS

| EP | 1 089 146 A2 | 4/2001 |
|---|---|---|
| EP | 1 191 570 A2 | 3/2002 |

OTHER PUBLICATIONS

International Search Report for PCT/EP2005/006372 dated Oct. 31, 2005.

* cited by examiner

*Primary Examiner*—Evan Pert
(74) *Attorney, Agent, or Firm*—David M. Krasnow

(57) ABSTRACT

A method of transferring a multi-variate process control model from one RF-powered plasma processing chamber (the reference chamber) to another nominally identical RF-powered plasma processing chamber (the target chamber) comprises first determining a multi-variate process control model on the reference tool based upon sensor data, 100. Then, a set of sensor data is taken for the reference chamber by running a designed experiment, 102, and a corresponding set of sensor data is taken for the target chamber using the same designed experiment, 104. The relationship between the reference and target chambers is determined by comparing the results of the designed experiments and calculating a transform matrix representing differences between the two chambers, 106. Finally, the process control model is transformed from the reference chamber to the target chamber using the transform matrix thus obtained, 108.

12 Claims, 10 Drawing Sheets

| DOE Parameter | variation from nominal wafer-processing condition |
|---|---|
| Power | +/-5% |
| Pressure | +/-5% |
| Electrode spacing | +/-5% |
| Process kit | +10% |

Response to power change        Response to electrode spacing change

| DOE parameter | variation from nominal wafer-processing condition |
|---|---|
| Power | +/-5% |
| Pressure | +/-5% |
| Electrode spacing | +/-5% |

METHOD FOR TRANSFERRING PROCESS CONTROL MODELS BETWEEN PLASMA PROCESSING CHAMBERS

CROSS-REFERENCE TO RELATED APPLICATION

This application claims priority to Irish patent application Ser. No. 2004/0568, filed Aug. 26, 2004, the entirety of which is incorporated herein by reference.

BACKGROUND OF THE INVENTION

1. Field of the Invention

The present invention relates to a method for transferring process control models between plasma processing chambers.

2. Prior Art

The manufacture of integrated circuits is a detailed process requiring many complex steps. A typical semiconductor manufacturing plant (or fab) can require several hundred highly complex plasma processing chambers to fabricate intricate devices such as microprocessors or memory chips. These fabs typically construct these devices on a substrate of silicon, known as a silicon wafer. A single wafer, containing many such similar integrated circuits, often requires over 200 individual steps to complete the manufacturing process. These steps include lithographic patterning of the silicon wafer to define each device, etching lines to create structures and filling gaps with metal or dielectric to create the electrical device of interest. From start to finish the process can take weeks to complete.

On each chamber the wafer is processed according to some recipe, which is controlled by the tool operator. This recipe includes input parameter settings such as process gas flow rates, chamber pressure, substrate/wall temperatures, RF power settings on one or more power generators, recipe time, inter-electrode spacing, etc. This is the case for all plasma processing tools, such as etch, deposition, etc. The wafer will undergo very many plasma process steps before completion. Each step contributes to the overall product yield; a fault at any one step may destroy potential product.

FIG. 1 shows a typical plasma process reactor. It includes a plasma chamber 1 containing a wafer or substrate 2 to be processed. A plasma is established and maintained within the chamber by an RF power source 3. This source generally has real impedance which must undergo a transformation to match that of the complex plasma load. This is done via match network 4. Power is coupled to the plasma chamber, typically by capacitive or inductive coupling, through an electrode 8. Process gases are admitted through gas inlet 7 and the chamber is maintained at a desirable pressure by a pump 11 pumping through gas exhaust line 10. A throttle valve 9 may be used to control pressure. The plasma permits effective manufacture of for example, semiconductor devices, by changing gas chemistry. Gases such as $Cl_2$, used to etch silicon and metal, for example, are converted into reactive and ionized species. Etching of the very fine geometry used to fabricate semiconductor devices is made possible by the reactive gases, ions and electrons of the plasma.

Referring again to FIG. 1, an RF sensor 5 is used to measure the RF electrical power signal in the complex post-match electrical line. A Fourier Transform is performed in data collection electronics 6 using a sampling technique which extracts the Fourier components of the voltage and current and the phase angle between these vectors. This data sampling should have sufficiently high resolution to determine the Fourier components across a very large dynamic range. Suitable techniques for high resolution sampling and measurement of the Fourier components are described in U.S. Pat. No. 5,808,415.

The output of the data collection electronics 6 is connected to a controller 12 which may be a computer or other system which uses the signals to yield information about and/or control the plasma process.

The Fourier components are very sensitive to plasma events. The wafer fabrication process involves running entire batches of wafers with similar plasma process recipes to ensure reliable volume production. If the plasma process on each wafer is the same, then the measured Fourier components will reflect this. Any change in the plasma process will be registered by change(s) in the Fourier components.

Key goals in a manufacturing plant are to maximise line yield (the percentage of wafers successfully processed) and die yield (the number of fully functioning devices on each wafer). Various process control mechanisms are used to optimise the performance of each tool to meet these objectives. One approach to process control is to apply a fault detection and classification (FDC) scheme to a fingerprint obtained from a sensor, such as the RF sensor described above.

An FDC scheme can be implemented as follows. First, the state of the process is measured using one or more sensors. The sensor data can be multidimensional data from a single sensor (e.g., Fourier components of the RF source 3 obtained from the sensor 5, as in the embodiment to be described), or data from a set of sensors, but in either case the data must be sensitive to hardware and process changes. The important criterion is that the sensor data has sufficient dimensions to permit a plurality of different fingerprints to be defined for a respective plurality of different fault conditions. The RF sensor described above fulfils these requirements. As used herein, a "fingerprint" is a set of sensor data which defines a particular state of the equipment—thus a fault fingerprint means a set of sensor data defining the state of the equipment in a fault condition. As wafers are processed through the chamber, the fingerprint is analysed to determine if the process is in an abnormal state. If such a state is detected, wafer processing is halted until the problem is resolved. This is the fault detection step. The time taken to solve the problem and restore the tool to production can be reduced by further classifying the abnormal process state against a historical record of known fault conditions to determine if a similar fault has re-occurred. This is the fault classification step.

A method for learning the profile of sensor data associated with a specific type of fault is described in U.S. Pat. No. 6,441,620 and is explained using the following simple example.

A designed experiment (DOE) is carried by varying three process inputs: power, pressure and electrode spacing. The DOE design is shown in FIG. 2. In addition, the experiment includes a fault condition whereby a process kit part of the wrong dimension is installed in the chamber. The process kit is a part of the chamber hardware that is replaced during preventive maintenance. Installing an incorrect part alters wafer processing conditions which can cause wafers to be scrapped. An RF impedance sensor is used to measure the subsequent changes in the plasma chamber.

FIG. 3 shows how three of the sensor outputs, A1 (RF voltage fundamental), A2 (first harmonic of RF voltage) and A3 (RF phase fundamental), respond to changes in power and electrode spacing on a given chamber. Sensor outputs A1 and A2 respond in a similar fashion to changes in power and spacing, but sensor output A3 responds differently. Thus, especially when all sensor outputs are taken into account, a change in process power will be different and distinguishable from a change in electrode spacing. If many of the hardware conditions and process inputs are changed in a design of experiments then a comprehensive tool profile comprising a set of sensor responses for all hardware and process input changes can be established, with each fault condition having its own unique fingerprint. A collection of sets of sensor data defining respective different fault conditions is referred to hereafter as a "fault library". Each fault-defining set of sensor data in the fault library is preferably recorded as a set of differences from the relevant sensor outputs when the process is in a known good state.

To perform fault detection and classification, changes in sensor outputs are recorded for each wafer as it is processed. The difference between the current sensor outputs, and the sensor outputs when the process was in the known good state, is compared to the fault library. A match is considered to have been found if the fingerprint of the wafer is well correlated to a fault fingerprint in the fault library. Typically, the user is presented with a chart which shows how the current wafer correlates to all fingerprints in the library. An example of such a chart is shown in FIG. 4. This indicates that the current wafer is well correlated to the process kit fault fingerprint in the library, and the user can have good confidence that the FDC system has found an accurate match.

The magnitude of the change can be used to perform fault detection. If the change exceeds a user-specified threshold, a fault detection decision is reported to the user. FIG. 5 shows the magnitude of change for a sequence of wafers processed with the wrong process kit part installed. These wafers are above a fault detection threshold which has been set so as not to cause any false alarms on known good wafers.

A typical wafer fab has many plasma chambers dedicated to each step of the process and each chamber requires a fault library. In some cases, it may not be possible to copy the fault library learned on one chamber directly to all other nominally identical chambers, and use it for fault detection and classification. FIG. 6 shows what happens when an identical process kit fault to that induced in the chamber referred to in relation to FIGS. 3 to 5, Chamber A, is induced on a second chamber, Chamber B, nominally identical to Chamber A, where the fault library has been copied directly from Chamber A. The fault detection signal has been reduced by a factor of 5. The reason for the reduced sensitivity can be seen in FIG. 7 which shows the corresponding correlation information. Identical faults induced on Chamber A and Chamber B are not well correlated.

Thus, this approach to process control has two limitations.

Decreased sensitivity: The robustness of the FDC system depends on a large signal-to-noise ratio for each fault compared to the baseline of normal behaviour. Reducing the signal-to-noise ratio of the FDC system can lead to faults being missed, with a subsequent impact to line yield, die yield and cost.

Reduced accuracy of classification: The trustworthiness of fault classification information depends on achieving a good match to a previously learned pattern when a similar fault re-occurs. If the same fault re-occurs but does not trigger a reasonably close match to a pattern in the fault library, a user's confidence in the FDC system is diminished.

An alternative strategy would be to build a new copy of the fault library on each chamber. This method also has a major limitation. As each fault is required to be learned through a designed experiment carried out while the chamber is not running production material, this method would require significant downtime and is very costly. This is especially true for those experiments which require chamber hardware to be temporarily modified, as is the case with the process kit fault described above.

It is also possible to construct a fault library using only those sensor parameters which are known to respond similarly across different chambers. This approach would also lead to reduced sensitivity as other parameters that contain useful information about a fault condition are not used.

Therefore, there is a need for a method for manipulating a fault library in some fashion so that it can be used on multiple chambers without sacrificing sensitivity.

SUMMARY OF THE INVENTION

According to the present invention there is provided a method of transferring a multi-variate process control model from one plasma processing chamber (the reference chamber) to another nominally identical plasma processing chamber (the target chamber), comprising the steps of:

(a) determining a multi-variate process control model on the reference tool based upon sensor data,
(b) taking a fingerprint of the reference chamber by running a designed experiment,
(c) taking a fingerprint of the target chamber by running the same designed experiment,
(d) determining the relationship between the reference and target chambers by comparing the results of the designed experiments and calculating a transform matrix representing differences between the two chambers, and
(e) transforming the process control model from the reference chamber to the target chamber using the transform matrix obtained in step (d).

While in general the reference and target chambers would be different, in one embodiment the reference and target chamber are one and the same chamber and the transformation method is used to update the process control model on the chamber.

BRIEF DESCRIPTION OF THE DRAWINGS

Embodiments of the invention will now be described, by way of example, with reference to the accompanying drawings, in which.

DETAILED DESCRIPTION OF A PREFERRED EMBODIMENT

Figure 8:
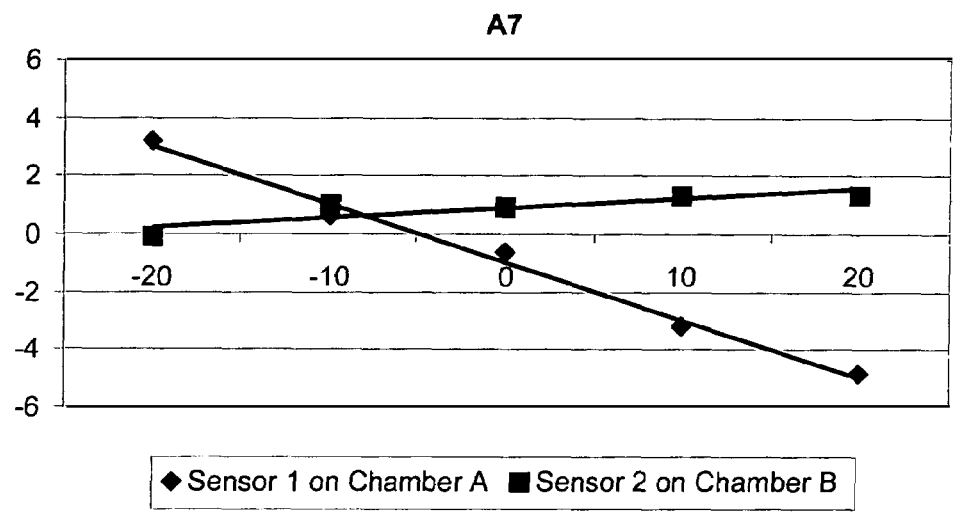
FIG. 8 illustrates the difference in sensor response for the same fault condition on two different chambers.

As described above, a library of fault fingerprints cannot be always be transferred from one chamber to another due to differences in the fingerprint recorded on each chamber. This is illustrated in FIG. 8, which shows the response of sensor output A7 ($14^{th}$ harmonic of current) to an electrode spacing change on two chambers running nominally the same recipe. The data is recorded by Sensor 1 on Chamber A and by Sensor 2 on Chamber B. Note that the response is very different so that an electrode spacing fault learned on Chamber A could not be used to detect the same fault on Chamber B, if the profile of the fault includes sensor parameter A7.

There are techniques available to compensate for the difference in response across multiple sensors, a process known as instrument standardization. Wang et al. ("*Multivariate Instrument Standardization*", Yongdong Wang et al, Analytical Chemistry, vol. 63, pp2750–2756, 1991) describe a range of techniques, which typically involve collecting sensor responses to a range of stimuli, and using the results to factor out sensor differences. Instrument standardization is used to transform data from multiple sensors to behave as it were collected on a single reference sensor. This allows models built using data collected on one sensor to be applied to data collected on other sensors. U.S. Pat. No. 5,549,677 describes instrument standardization techniques that are specific to optical spectrometers, in particular a "direct standardization" method which is referred to further below.

Figure 9:
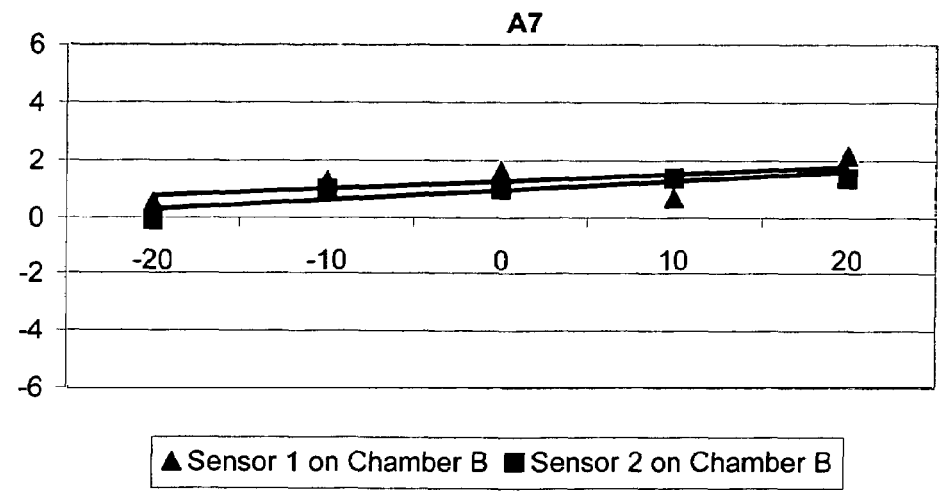
FIG. 9 shows the similarity in sensor response for the same fault condition measured using two different sensors on the same chamber.

It is useful to determine if the difference in Chamber response shown in FIG. 8 is due to a variation in the sensors. FIG. 9 shows the result of an experiment where the two sensors were installed on Chamber A. In this case, both sensors have nearly identical responses to an electrode spacing change. The sensor-swap experiment confirms that the chamber-to-chamber response variation is not due to the sensor but rather due to differences in the wafer processing chamber itself. This could be due differences in how the chambers were manufactured, assembled or calibrated. Therefore, applying instrument standardization will not solve the problem, as the cause of variation does not lie with the sensor.

As can be seen in FIG. 8, the chamber-to-chamber variation has the effect of changing the slope of the response of parameter A7 to an electrode spacing fault. In effect, the response has been rotated. More generally, the response could be rotated and scaled (either amplified or attenuated). It is possible to characterise the difference between chambers by measuring the amount of scaling and rotation that occurs.

We have discovered that by estimating the scaling and rotation differences, a compensation technique can be used such that a fault library built on one chamber, Chamber A, can be used on another nominally identical chamber, Chamber B. The method used is to run the same DOE, such as that shown in FIG. 10, on Chamber A and on Chamber B. This DOE is designed to be run with minimal impact to chamber productivity, and is considerably simplified compared to the original full DOE used to establish the initial fault library on Chamber A. The simplified, or "short", DOE is typically a subset of the original full DOE but this is not necessary. Typically, a short DOE can be performed in hours compared to days for a full DOE. The difference in response to the DOE on two chambers can be estimated as described below.

The DOE results can be represented as a matrix whose dimensions are n×m, where n is the number of runs in the DOE, and m is the number of Fourier components measured by the RF sensor.

Because of chamber differences, the DOE results from each chamber are not identical, but they can be related to each other as $$DOE_B = DOE_A\, T$$

where $DOE_A$ is an n×m matrix representing the DOE results on chamber A and $DOE_B$ is the corresponding set of results from chamber B. T is a transform matrix relating the results of the two DOE's. Re-arranging the equation to solve for T yields $$T = DOE_A^{\#} DOE_B$$

where $DOE_A^{\#}$ is the pseudo-inverse of $DOE_A$ matrix, calculated using a suitable technique. T is a unique least-squares solution.

The transform matrix T captures the difference between the chambers. In this case, the transform captures rotation and scaling differences between sensor responses on different chambers, but in principal could be extended to capture other differences such as differences in the coefficients of non-linear models.

The transform matrix can be used to transform any data or multi-variate model from one chamber so it appears to have been measured on a different chamber. This is a direct transformation method which is superficially similar to the direct standardization technique in U.S. Pat. No. 5,549,677 but with key differences. Firstly, it is not applied to correct for sensor variation; rather to it is intended to remove differences in the signal output from two wafer processing chambers in the case where the sensors are matched. Secondly, it is applied to RF rather than optical spectroscopy data. Finally, its field of application is in process control rather than instrument calibration.

Each fault which has been learned on Chamber A can be represented as an 1×m vector where m is the number of Fourier components measured by the RF sensor. All fault fingerprints learned on Chamber A can be combined into a single fault library which can be represented as a matrix dimensioned p×m, where p is the number of faults in the library and m is the number of components.

As described above, this library can not always be deployed on Chamber B directly. However, if it can be transformed as follows $$FL_B = FL_A\, T$$

where $FL_B$ is a transformed fault library, T the transform matrix and $FL_A$ is the full fault library available on Chamber A. The $FL_B$ library will now behave as it were learned on Chamber B.

Figures 10, 11:
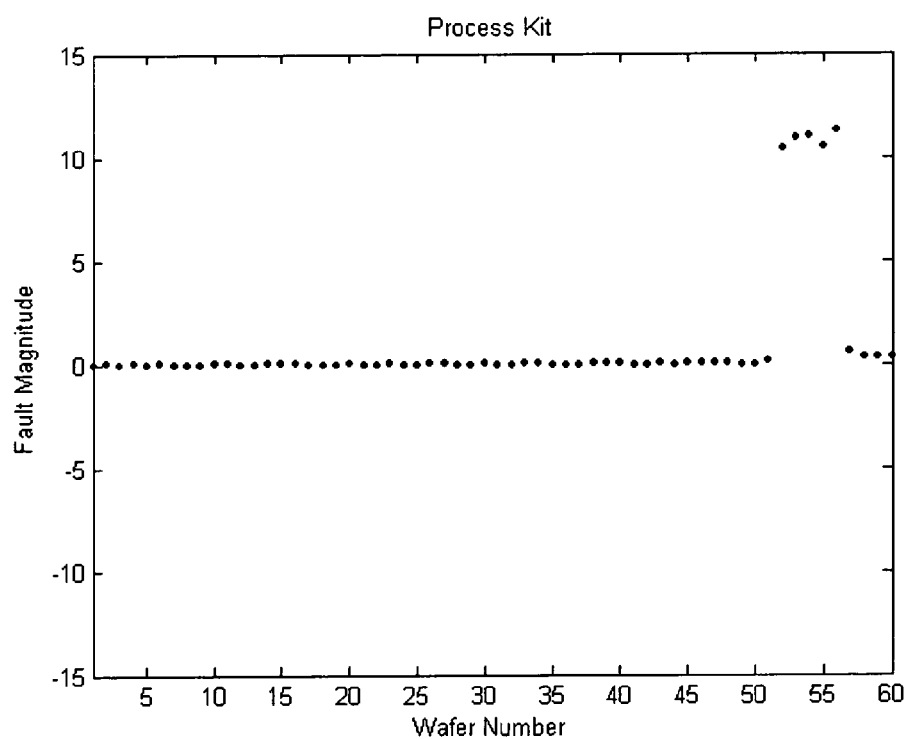
FIG. 10 describes a simplified design of experiments used to characterise the differences between chambers.
FIG. 11 shows the improved sensitivity when a transformed fault library is used.

FIG. 11 shows the results of a fault detection experiment where a fault library learned on Chamber A is first transformed before being tested on Chamber B. Comparing FIG.

Figures 1, 2:
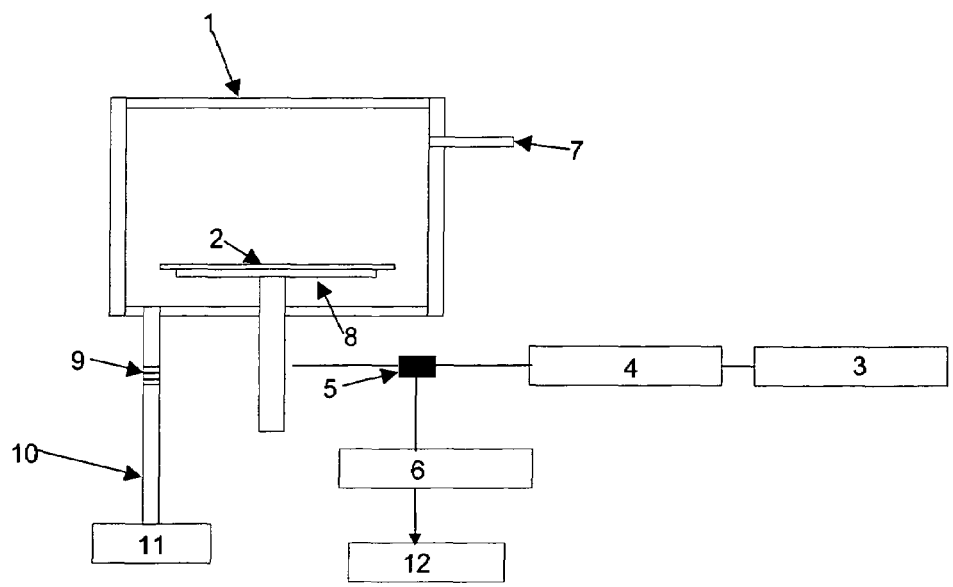
FIG. 1 depicts a typical plasma processing chamber.
FIG. 2 describes the scheme for a designed experiment (DOE) to build a fault detection and classification (FDC) model.
Figure 3:
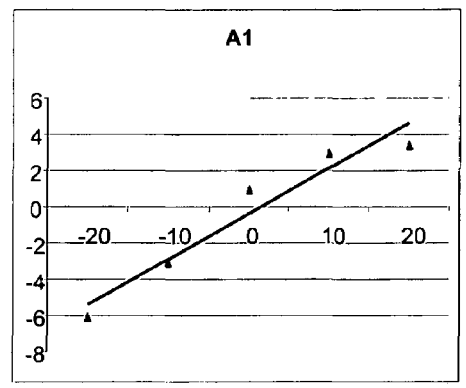
FIG. 3 shows the response of three sensor outputs to variations in two process inputs.
Figure 3:
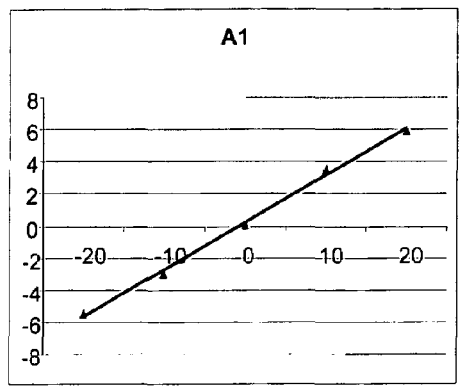
Figure 3:
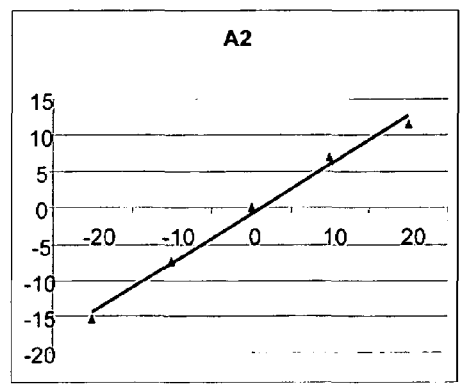
Figure 3:
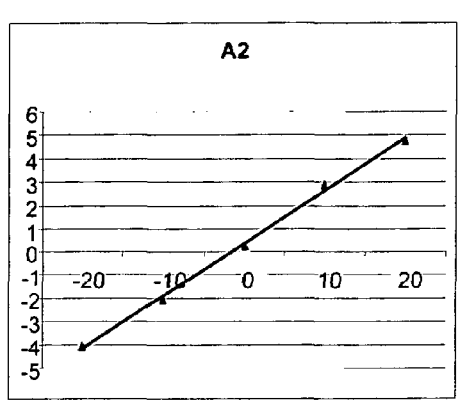
Figure 3:
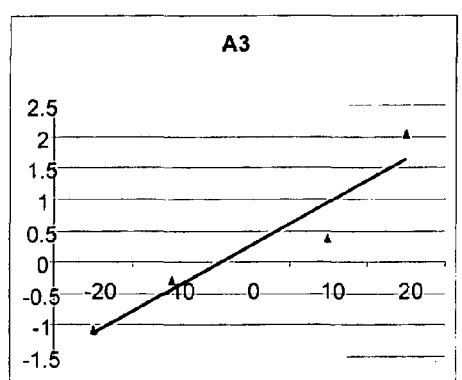
Figure 3:
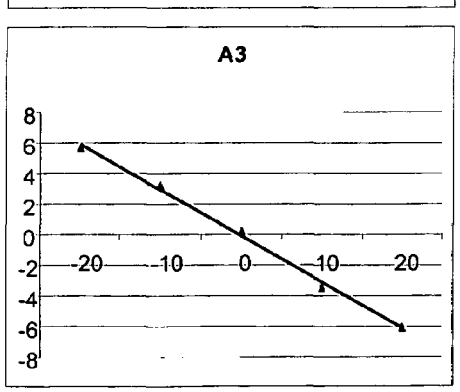
Figure 4:
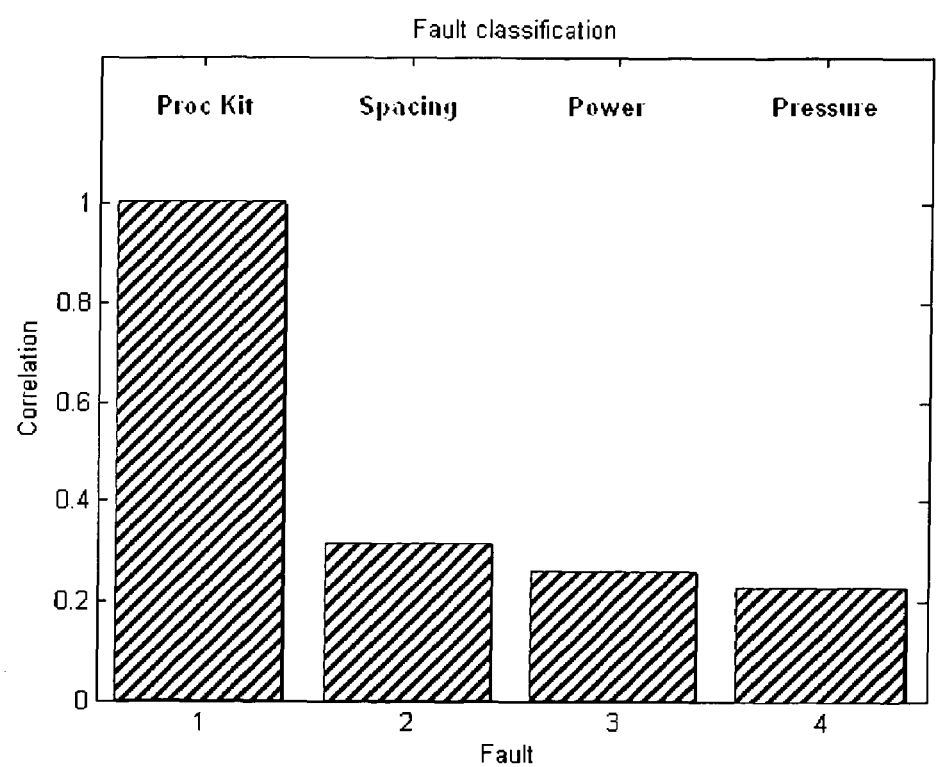
FIG. 4 is a chart showing the degree of correlation between a fault wafer and each of the faults in a fault library.
Figure 5:
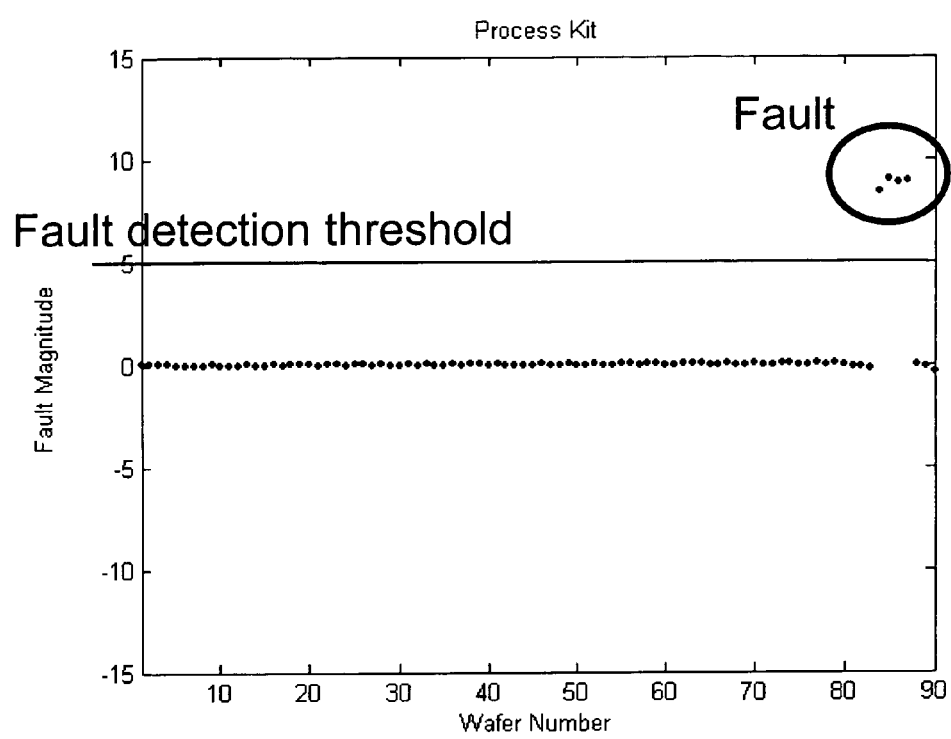
FIG. 5 is fault detection chart showing the magnitude of change for a fault compared to normal wafers.
Figure 6:
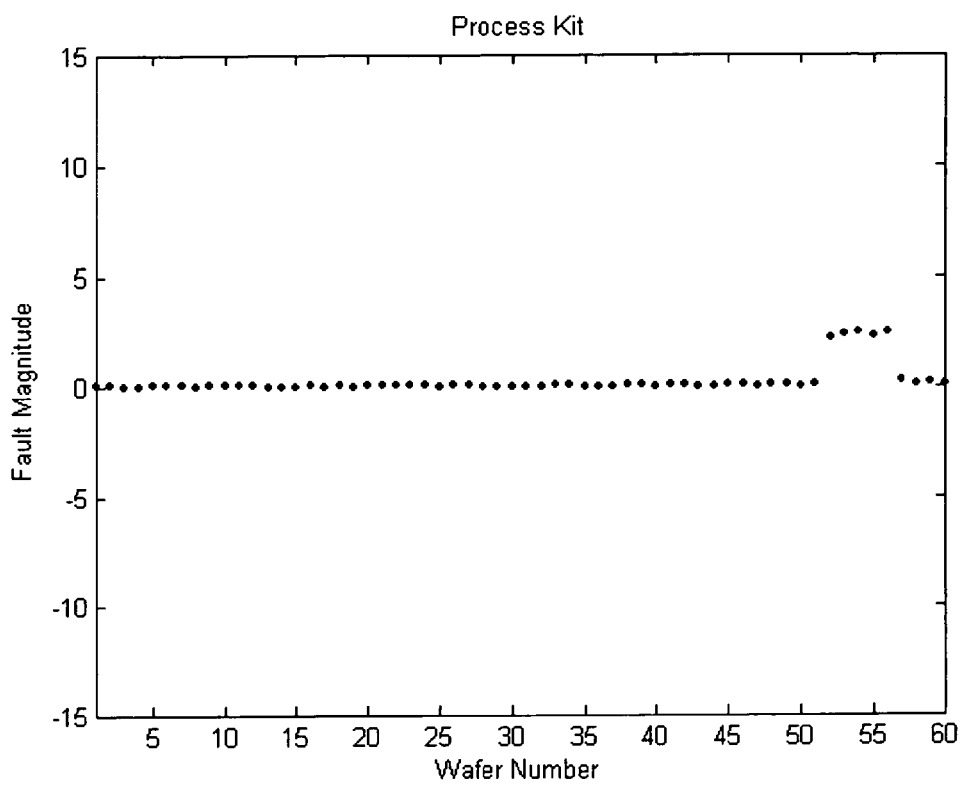
FIG. 6 shows the reduced sensitivity to a process kit error when a fault library is copied directly from one chamber to another.
Figure 7:
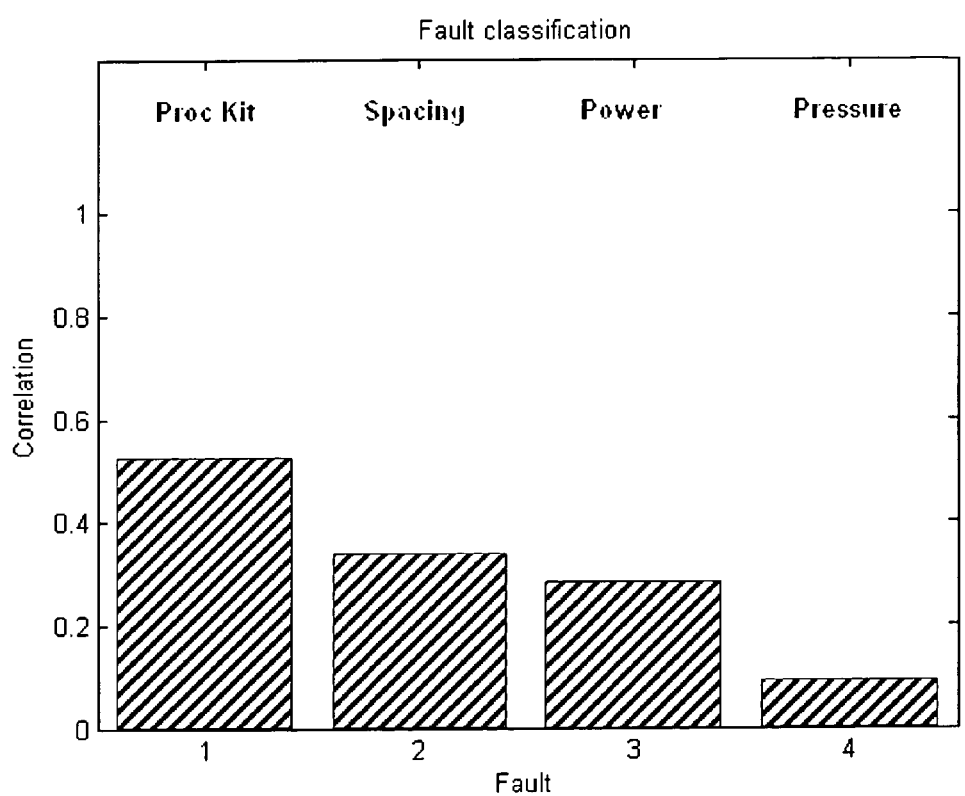
FIG. 7 shows the diminished degree of pattern matching when a fault library is copied directly from one chamber to another.
Figure 12:
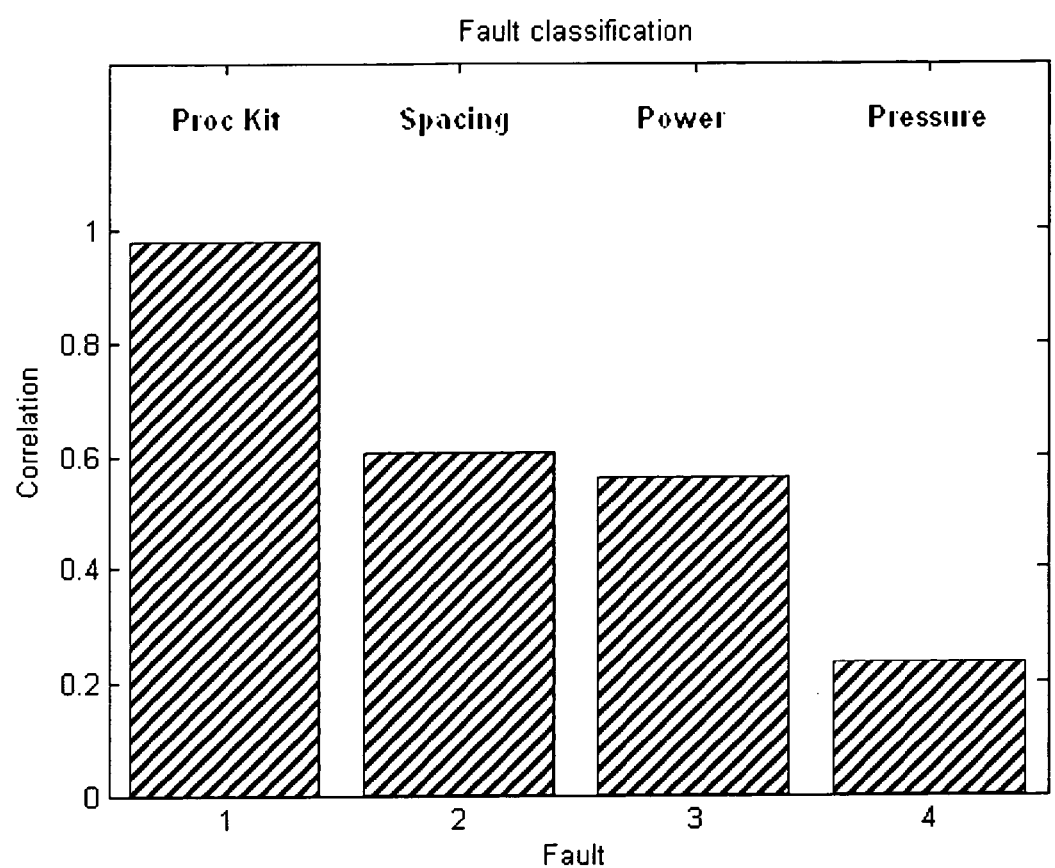
FIG. 12 shows the improved correlation when a transformed fault library is used.

11 and FIG. 6, sensitivity has been increased by using the transformation process. Similarly, FIG. 12 shows that the accuracy of the fault matching process (essential for reliable classification) has also been enhanced. Recalling that the fault tested on Chamber B is being compared to a pattern learned on Chamber A, the accuracy of the pattern match is now as good as if the fault were learned on the Chamber B directly.

Figure 13:
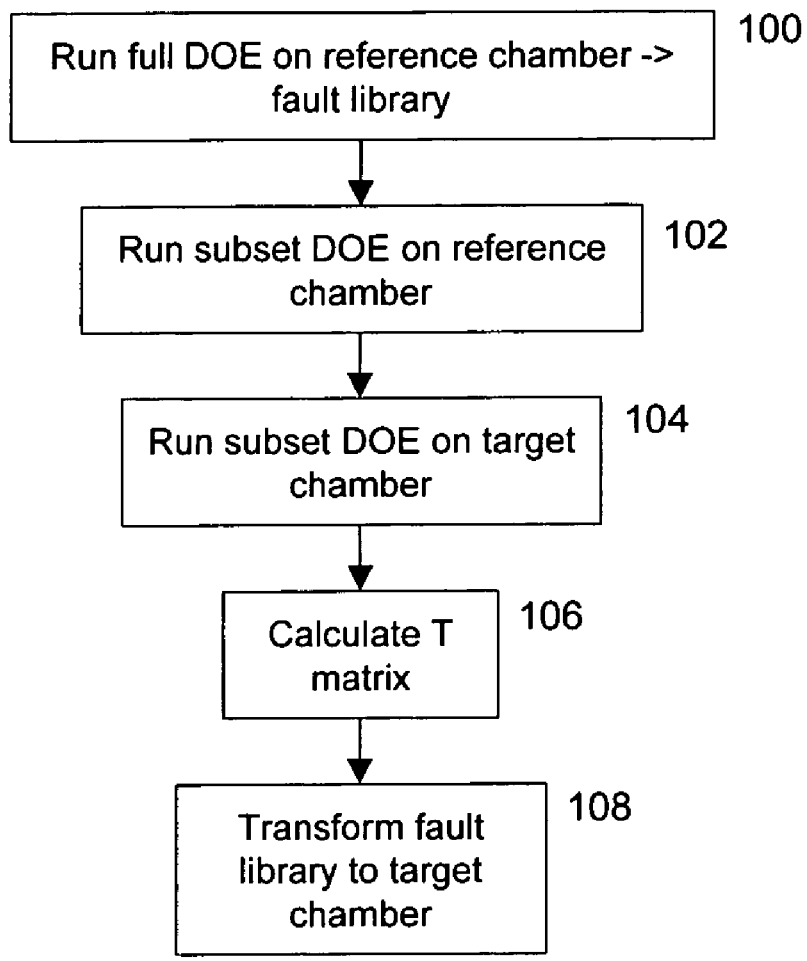
FIG. 13 is a flow chart illustrating an embodiment of the invention.

FIG. 13 is a flow diagram of an embodiment of the invention for deploying fault libraries or other multi-variate process control models from chamber to chamber. A full DOE is run on one chamber, called the reference chamber, to build a fault library with multi-variate fingerprint data, step 100. A subset of the full DOE that can be run with minimal impact to chamber productivity is run on reference chamber, step 102, and on the chamber where the model is to be transferred, called the target chamber, step 104. As mentioned, the DOE in steps 102 and 104 is typically a subset of the DOE used to build the full fault library on the reference chamber. The transform matrix T is calculated, step 106. A transform of the fault library from the reference chamber to the target chamber is then calculated using T, step 108.

The chamber transformation technique can be used to copy any multi-variate process control model from one chamber to another. The transform matrix T is calculated in a similar manner, but rather than copy a fault library between chambers, other process control models can be used. For example, U.S. Pat. No. 6,781,383 describes a method for designing a model of sensor parameters that is predictive of die yield. This model could be a linear model of sensor parameters such as $$Y_A = \alpha A1 + \beta A2 + \chi A3 + \delta A4$$

where y is the model output indicative of a yield parameter such as etch rate or critical dimension, A1–A4 are sensor parameters and $\alpha, \beta, \chi, \delta$ are the model parameters. If this model were developed on Chamber A it could be transferred to other chambers using transform technique so that $$Y_B = Y_A T$$

is the corresponding model for Chamber B. In this example, T would be dimensioned as a 4×4 matrix, as just 4 sensor parameters are used. In general, any multi-variate model can be transferred in this way.

It is also possible to learn the transform matrix T other than by running a designed experiment which requires wafers to be processed in the chamber. For example, the chambers could be fingerprinted using a plasma-less test, whereby a fingerprint is recorded with RF power applied to the chamber but without igniting a plasma. This does not require a wafer to be present in the chamber.

A transform can be created between any pair of nominally identical chambers, allowing models to be transferred at will across an entire production line.

The transform can also be used to update a fault library on the same chamber, where the chamber has been significantly altered by a major preventive maintenance activity or hardware retrofit. In this case, the transform T, accounts for the modification to the same chamber over a period of time as shown below.

$FL_A$ is a fault library learned on Chamber A, and $DOE_A$ is short DOE on Chamber A. Chamber A is then modified so that its response is altered. If $DOE_{A'}$ is a DOE run after the modification, then the transform T can be learned as $$T = DOE_A^\# DOE_{A'}$$

and used to generate a fault library $FL_{A'}$ that compensates for the chamber modification as follows $$FL_{A'} = FL_A T$$

Although the foregoing has described an embodiment where the sensor outputs are Fourier components of the RF source, as derived from the single RF sensor 5, the initial full DOE as well as the subsequent short DOE's, can use the data from non-RF sensors, or from a combination of RF and non-RF sensors. For example, ion flux sensors can be used, as well as optical sensors and sensors for residual gas analysis.

The invention is not limited to the embodiments described herein which may be modified or varied without departing from the scope of the invention.

The invention claimed is:

1. A method of transferring a multi-variate process control model from one plasma processing chamber (the reference chamber) to another nominally identical plasma processing chamber (the target chamber), comprising the steps of:
    (a) determining a multi-variate process control model on the reference tool based upon sensor data,
    (b) taking a fingerprint of the reference chamber by running a designed experiment,
    (c) taking a fingerprint of the target chamber by running the same designed experiment,
    (d) determining the relationship between the reference and target chambers by comparing the results of the designed experiments and calculating a transform matrix representing differences between the two chambers, and
    (e) transforming the process control model from the reference chamber to the target chamber using the transform matrix obtained in step (d).

2. The method of claim 1, wherein step (a) is performed using a designed experiment and steps (b) and (c) are performed on a simpler designed experiment than that used for step (a).

3. The method of claim 2, wherein the designed experiment performed in steps (b) and (c) is a subset of the designed experiment performed in step (a).

4. The method of claim 2, wherein the designed experiment performed in steps (b) and (c) is performed without a plasma in the chamber.

5. The method claimed in claim 1, wherein the plasma processing chamber is an RF-powered plasma processing chamber.

6. The method of claim 5, wherein the fingerprint in steps (b) and (c) is recorded using at least an RF impedance sensor.

7. The method of claim 5, wherein the fingerprint in steps (b) and (c) is recorded using at least one sensor other than an RF impedance sensor.

8. The method of claim 1, wherein the fingerprint in steps (b) and (c) is recorded using more than one sensor.

9. The method of claim 5, wherein the sensor data comprises a plurality of Fourier components of the RF power source driving the chamber.

10. The method of claim 1, wherein the process control model is a fault library.

11. The method of claim 1, wherein the process control model is a yield-prediction model.

12. The method of claim 1, wherein the reference and target chamber are one and the same chamber and the transformation method is used to update the process control model on the chamber.

* * * * *